(12) United States Patent
Huang et al.

(10) Patent No.: US 11,396,970 B2
(45) Date of Patent: Jul. 26, 2022

(54) QUICK RELEASE STRUCTURE

(71) Applicant: SYNCMOLD ENTERPRISE CORP., New Taipei (TW)

(72) Inventors: Chun-Hao Huang, New Taipei (TW); Chien-Cheng Yeh, New Taipei (TW); Shuen-Fa Yang, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 113 days.

(21) Appl. No.: 17/073,904

(22) Filed: Oct. 19, 2020

(65) Prior Publication Data

US 2021/0156507 A1 May 27, 2021

Related U.S. Application Data

(60) Provisional application No. 62/941,237, filed on Nov. 27, 2019.

(30) Foreign Application Priority Data

Jul. 13, 2020 (TW) .................................. 109208877

(51) Int. Cl.
*F16M 11/04* (2006.01)
*F16B 5/06* (2006.01)
*H05K 5/02* (2006.01)

(52) U.S. Cl.
CPC ......... *F16M 11/041* (2013.01); *F16B 5/0628* (2013.01); *H05K 5/0204* (2013.01)

(58) Field of Classification Search
CPC ............ F16M 11/041; F16M 2200/08; F16M 13/022; F16M 11/2064; F16M 11/18; H05K 5/0234; H05K 7/18; H05K 5/0204; Y10S 248/917; Y10S 248/919; Y10S 248/918; Y10S 248/92; A47B 2097/005;
(Continued)

(56) References Cited

U.S. PATENT DOCUMENTS 7,028,961 B1 * 4/2006 Dittmer .................. F16M 11/04
248/278.1
7,775,494 B2 * 8/2010 Yen ...................... F16M 11/046
361/679.21

(Continued)

*Primary Examiner* — Michael A Matey
(74) *Attorney, Agent, or Firm* — Muncy, Geissler, Olds & Lowe P.C.

(57) ABSTRACT

A quick release structure for bearing a display on a supporting stand is provided. The quick release structure comprises a bearing module and a housing module. The bearing module is disposed on the supporting stand, and comprises a first main board, a second main board, an accommodating space, a plurality of elastic members and an operating button. The elastic members are disposed in an accommodating space. The housing module is disposed on the display and comprises a housing and a plurality of limit columns being disposed on the housing. When the bearing module and the housing module are in an assembling status, the limit columns is penetrated the perforations and engaged with the corresponding elastic members, respectively; when an external force is applied to the operating button, the operating button is configured to deform the elastic members for detaching the limit columns from the elastic members.

12 Claims, 8 Drawing Sheets

(58) Field of Classification Search
CPC ............... A47B 2097/006; A47B 9/02; G06F 2200/1612; F16B 21/02; F16B 5/0628
See application file for complete search history.

(56) References Cited

U.S. PATENT DOCUMENTS

| | | | | |
|---|---|---|---|---|
| 8,083,193 | B2 * | 12/2011 | Matsui | F16M 11/041 |
| | | | | 248/222.51 |
| 9,046,216 | B2 * | 6/2015 | Lu | F16M 11/28 |
| 9,857,020 | B2 * | 1/2018 | Yeh | F16M 11/18 |
| 9,857,021 | B2 * | 1/2018 | Yeh | F16M 11/2014 |
| 9,976,691 | B2 * | 5/2018 | Chin | F16M 11/2014 |
| 10,018,225 | B1 * | 7/2018 | Yen | F16C 33/1095 |
| 10,309,578 | B2 * | 6/2019 | Yen | F16M 11/041 |
| 11,112,056 | B2 * | 9/2021 | Yen | F16M 11/10 |
| 11,187,254 | B2 * | 11/2021 | Chou | F16B 21/02 |
| 2006/0076463 | A1 * | 4/2006 | Drew | G06F 1/1601 |
| | | | | 248/917 |
| 2006/0231667 | A1 * | 10/2006 | Tsuo | F16M 11/041 |
| | | | | 248/917 |
| 2012/0250232 | A1 * | 10/2012 | Li | F16M 11/041 |
| | | | | 361/679.01 |
| 2013/0044411 | A1 * | 2/2013 | Zhen | F16M 11/22 |
| | | | | 361/679.01 |
| 2013/0094127 | A1 * | 4/2013 | Lu | F16M 11/06 |
| | | | | 361/679.01 |
| 2014/0240200 | A1 * | 8/2014 | Khor | F16M 11/24 |
| | | | | 345/1.3 |
| 2014/0263929 | A1 * | 9/2014 | Grziwok | F16M 11/22 |
| | | | | 248/553 |
| 2016/0312950 | A1 * | 10/2016 | Bowman | F16M 11/2092 |
| 2020/0393077 | A1 * | 12/2020 | Huang | A47B 97/00 |
| 2021/0199234 | A1 * | 7/2021 | Huang | F16M 11/16 |

* cited by examiner

QUICK RELEASE STRUCTURE

CROSS REFERENCE TO RELATED APPLICATION

This application claims the benefit of U.S. Provisional Application Ser. No. 62/941,237 filed on Nov. 27, 2019, and the benefit of Taiwan Patent Application Serial No. 109208877 filed on Jul. 13, 2020. The entirety of each Application is incorporated herein by reference.

BACKGROUND OF THE INVENTION

1. Field of the Invention

The present invention relates to a quick release structure. More particularly, the present invention relates to a quick release structure for bearing a display.

2. Description of Related Art

In general, the display usually needs to be fixed on a supporting stand so that it can be stably installed on a wall or a work surface for users to use. Users sometimes need to replace the display. In order to allow users to easily unload the display from the supporting stand, a quick release structure between the display and the support stand was provided. However, the conventional quick release structure requires more assembly parts, which makes the cost of the quick release structure higher. Therefore, in order to reduce the cost of the quick release structure, a quick release structure that can reduce the amount of assembly parts and is easy to operate is required.

SUMMARY OF THE INVENTION

The main object of the present invention is to provide a quick release structure for bearing a display on a supporting stand. The quick release structure comprises a bearing module and a housing module. The bearing module is disposed on the supporting stand, and comprises a first main board, a second main board, an accommodating space, a plurality of elastic members and an operating button. The second main board is secured to the first main board and includes a plurality of perforations. The accommodating space is formed between the first main board and the second main board. The elastic members are disposed in the accommodating space. The operating button movably penetrates through the first main board and extends into the accommodating space to abut against the elastic members. The housing module is disposed on the display and comprises a housing and a plurality of limit columns being disposed on the housing. When the bearing module and the housing module are in an assembling status, the limit columns correspondingly penetrate the perforations and engage with the elastic members, respectively. When an external force is applied to the operating button, the operating button is configured to deform the elastic members for detaching the limit columns from the elastic members.

In one embodiment, the limit column comprises an outer periphery and a groove formed on the outer periphery, and in the assembling status, the elastic member is partially accommodated in the groove.

In one embodiment, the elastic member comprises a headend, two clamping sections extending from the headend and two tail sections respectively connected to the two clamping sections and opposite to the headend.

In one embodiment, the bearing module further comprises a plurality of positioning columns being disposed between the first main board and the second first main board. The headend is sleeved on the positioning columns, the two clamping sections clamp the limit columns, and the operating button movably abuts against the two tail sections.

In one embodiment, the positioning column is a step screw, which is secured on the second main board to limit the headend of the elastic members.

In one embodiment, an interval is formed between the two tail sections. The operating button comprises a pressing portion and a tapered portion relative to the pressing portion. The pressing portion protrudes from the first main board. The tapered portion faces towards the second main board and is tapered from the first main board to the second main board. The tapered portion abuts against the two tail sections. When the external force is applied to the pressing portion, the operating button moves toward the second main board and the tapered portion is configured to deform the elastic members to increase the interval of the two tail sections.

In one embodiment, when the external force is removed, the interval of the two tail sections is decreased by an elastic restoring force to reset the operating button.

In one embodiment, the first main board further comprises a containing hole for accommodating the pressing portion of the operating button.

In one embodiment, a front edge of the limit column includes an annular incline plane. When the bearing module and the housing module are in the assembling status, the limit columns is configured to utilize the annular incline plane to push the two clamping sections of the elastic members, so that the two clamping sections are accommodated in the groove.

In one embodiment, the elastic member is a clip spring, which is formed by bending a metal wire.

In one embodiment, the elastic member is a sheet metal spring, which correspondingly surrounds the limit columns and engages with the groove.

In one embodiment, the second main board further comprises at least one lug portion to buckle on the housing.

The quick release structure is capable of utilizing the clip springs and the limit columns to fix the quick release structure on the supporting stand. When the display is mounted on the supporting stand, the clip springs and the limit columns are used to quickly buckle each other. When the external force is applied to the operating button, the operating button is configured to stretch the elastic members, so that the housing module can be detached from the supporting stand. When the external force is removed, the elastic restoring force of the clip spring can reset the operating button, and additional reset spring is not required. In this way, by assembling the housing module on the housing of the display, the display can be quickly assembled with or detached from the supporting stand. Moreover, the clip springs and the limit columns are utilized to fulfill the functions of quick release and reduction for the amount of assembly parts which achieves the effect of reducing the manufacture cost of the quick release structure.

DETAILED DESCRIPTION OF THE PREFERRED EMBODIMENT

Figure 1:
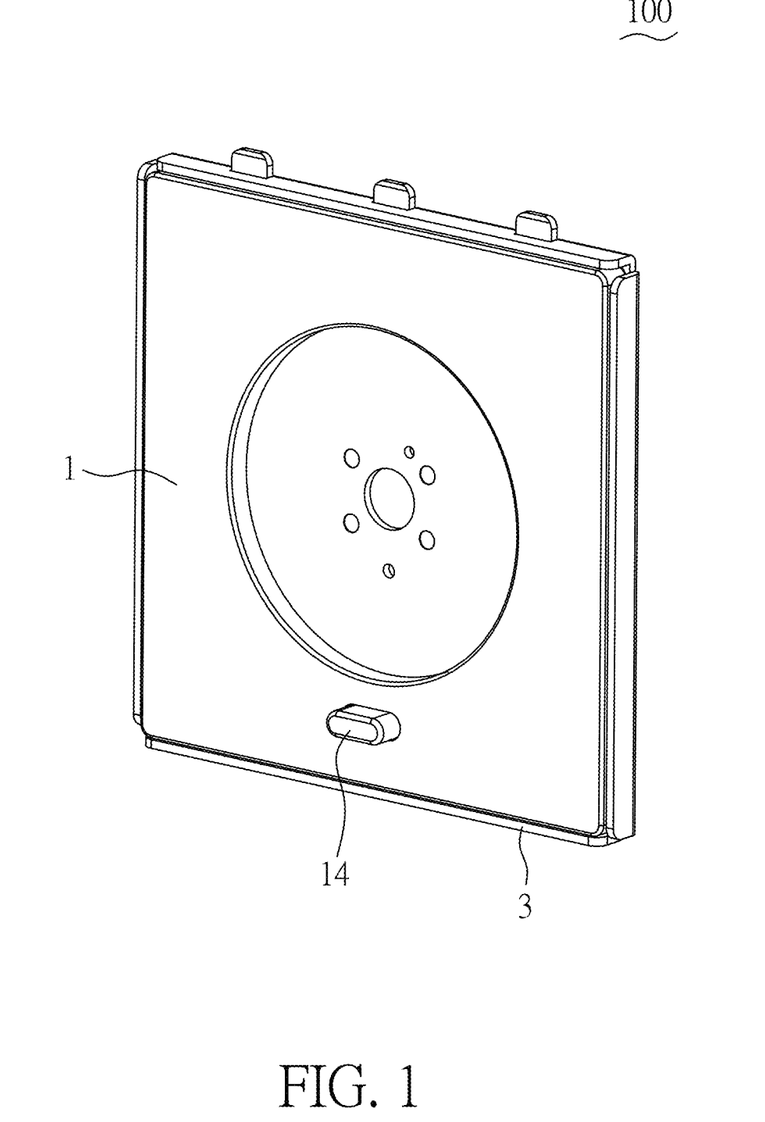
FIG. 1 is a perspective view showing an embodiment of the quick release structure of the present invention.
Figure 2:
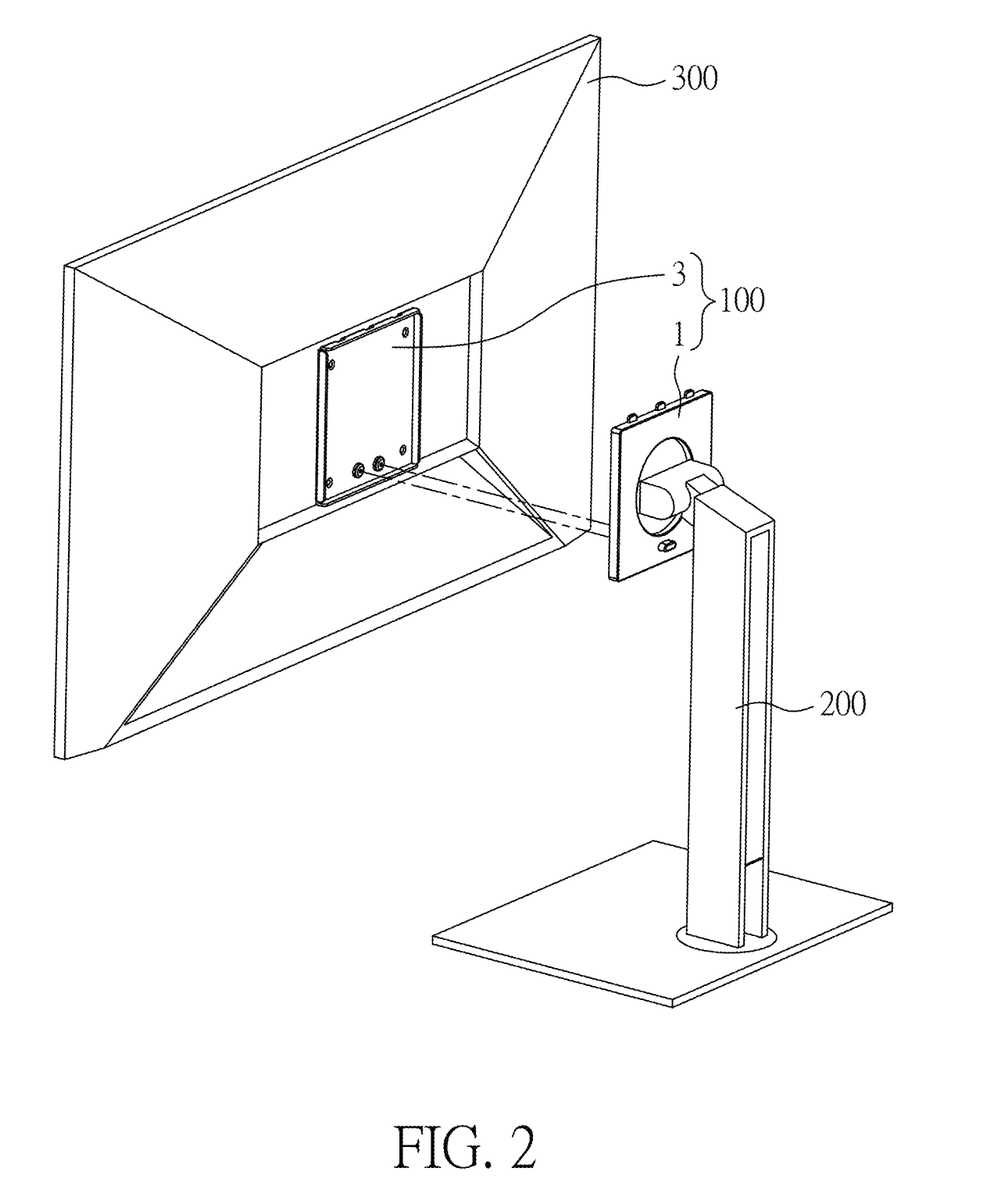
FIG. 2 is a schematic view showing an embodiment of the supporting stand with display of the present invention.

Please refer to FIG. 1 and FIG. 2. FIG. 1 is a perspective view showing an embodiment of the quick release structure 100 of the present invention, and FIG. 2 is a schematic view showing an embodiment of the supporting stand 200 with a display 300 of the present invention. As shown in FIG. 1 and FIG. 2, the quick release structure 100 includes a bearing module 1 and a housing module 3. The bearing module 1 is disposed on the supporting stand 200, and the housing module 3 is disposed on the housing of the display 300. When the bearing module 1 and the housing module 3 are in an assembling status, the quick release structure 100 is configured to support the display 300 on the supporting stand 200.

Figure 3:
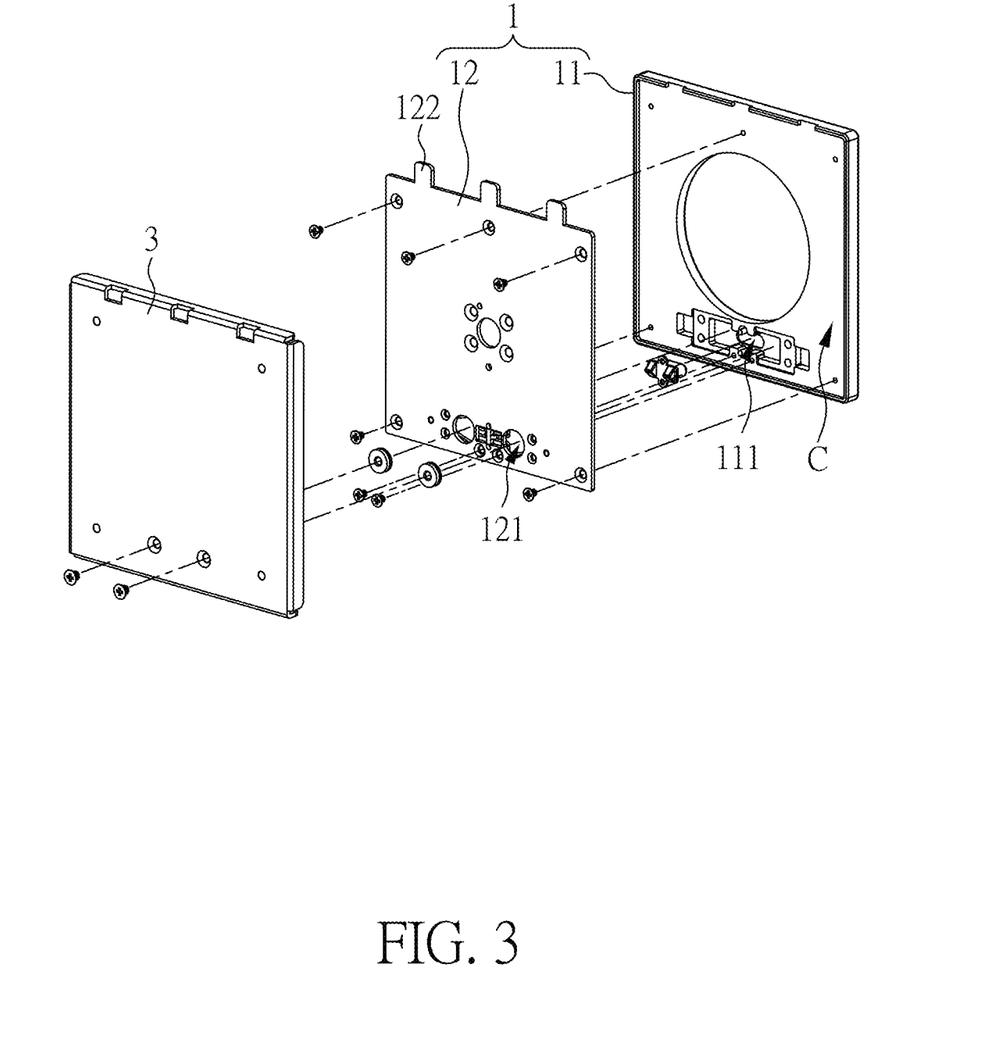
FIG. 3 is an exploded perspective view showing an embodiment of the quick release structure of the present invention.
Figure 4:
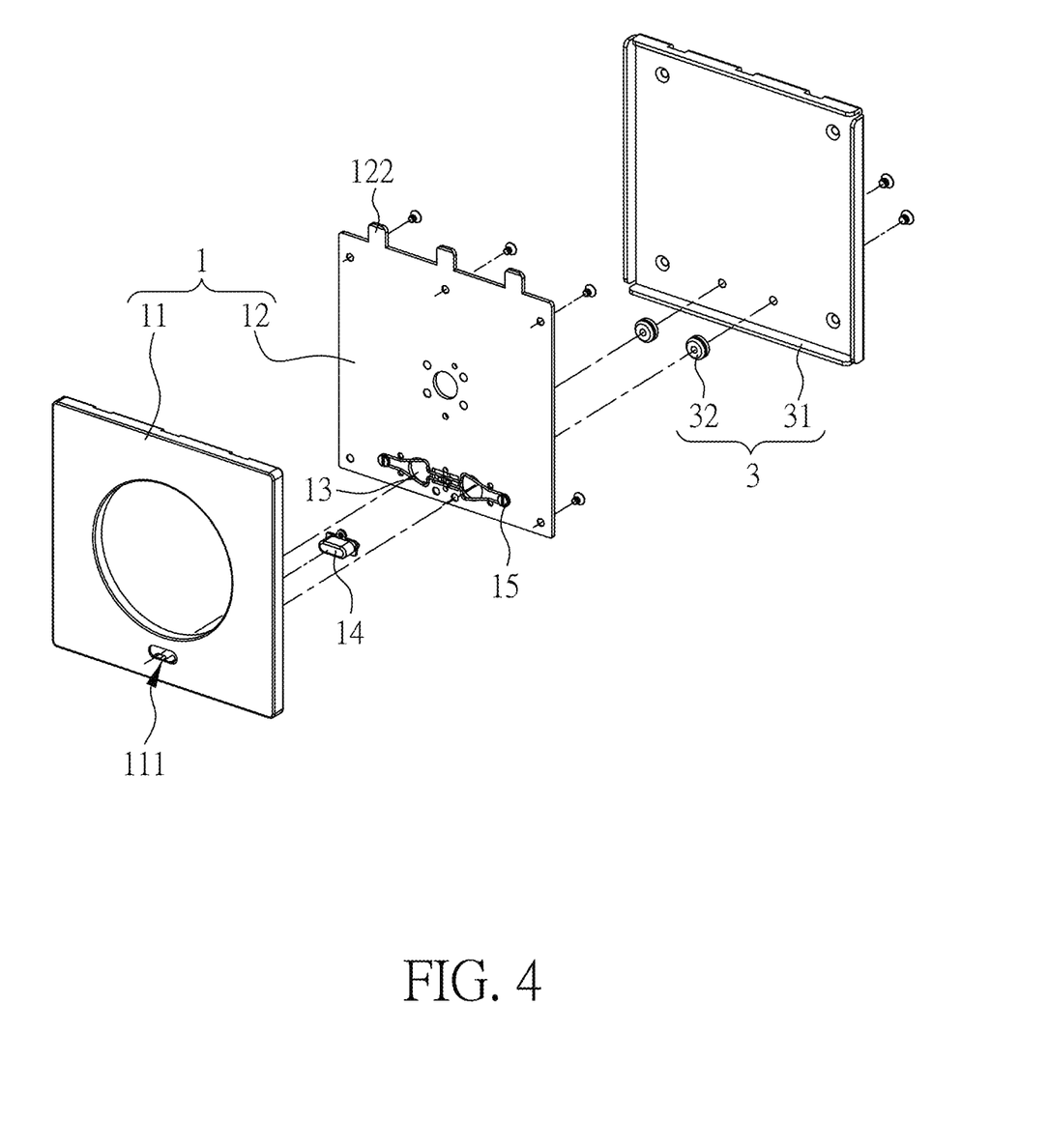
FIG. 4 is another exploded perspective view showing an embodiment of the quick release structure of the present invention.

Please refer to FIG. 3 and FIG. 4. FIG. 3 is an exploded perspective view showing an embodiment of the quick release structure 100 of the present invention, and FIG. 4 is another exploded perspective view showing an embodiment of the quick release structure 100 of the present invention. The bearing module 1 includes a first main board 11, a second main board 12, a plurality of elastic members 13 and an operating button 14. The first main board 11 includes a containing hole 111, and the operating button 14 is configured to penetrate through the containing hole 111. The second main board 12 is secured to the first main board 11, and an accommodating space C is formed between the first main board 11 and the second main board 12. The second main board 12 includes multiple perforations 121 and at least one lug portion 122. The elastic members 13 are disposed in the accommodating space C. The operating button 14 is movably penetrating through the first main board 11 and extending into the accommodating space C to abut against the elastic members 13.

The housing module 3 is disposed on the display 300, and the housing module 3 includes a housing 31 and a plurality of limit columns 32 being disposed on the housing 31. When the bearing module 1 and the housing module 3 are in the assembling status, the limit columns 32 are engaged with the corresponding elastic members 13 via the perforations 121, and the lug portion 122 is configured to buckle on the housing 31 (the housing 31 has at least one corresponding slot). When an external force is applied to the operating button 14, the operating button 14 is configured to deform the elastic members 13, for detaching the limit columns 32 from the elastic members 13. It is noticed that, the housing module 3 is secured on the housing of the display 300 via screws, however, the disclosure is not limited thereto.

Figure 5:
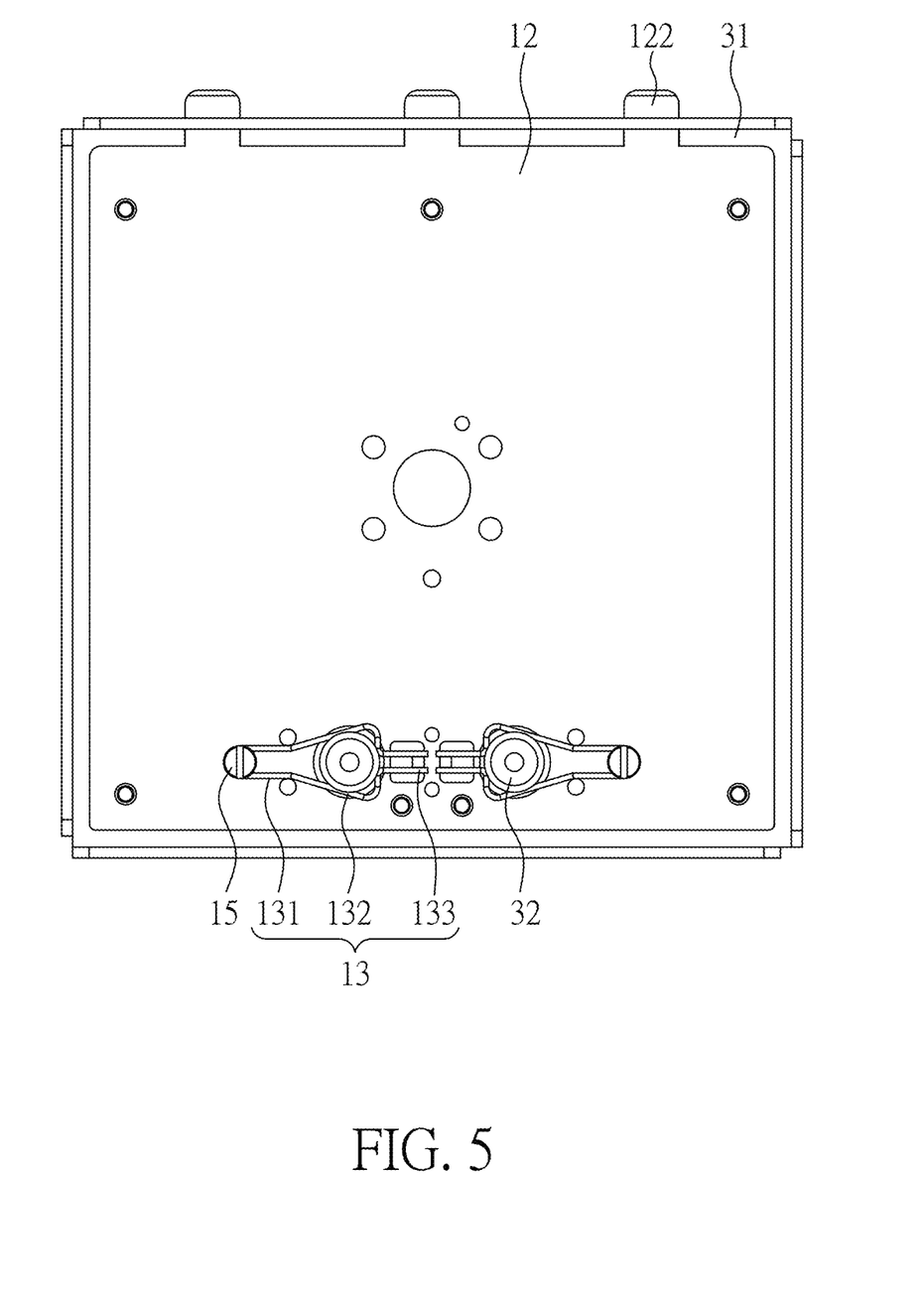
FIG. 5 is a schematic view showing an embodiment of the second main board and the housing module of the present invention.

Please refer to FIG. 5. FIG. 5 is a schematic view showing the second main board 12 and the housing module 3 of the present invention. As shown in FIG. 5, one of the elastic members 13 includes a headend 131, two clamping sections 132 extending from the headend 131, and two tail sections 133 respectively connected to the clamping sections 132 and opposite to the headend 131. Other elastic members have similar structures, which will not be repeated here. The bearing module 1 further includes a plurality of positioning columns 15, and the positioning columns 15 are disposed between the first main board 11 and the second main board 12. That is, the positioning columns 15 are disposed in the accommodating space C. The headend 131 are correspondingly sleeved on the positioning columns 15, and the two clamping sections 132 are firmly clamped the corresponding limit columns 32. It is noticed that, each of the positioning columns 15 can be implemented as a step screw. The step screws are secured on the second main board 12, and are configured to limit the headend 131 of the elastic members 13.

Figure 6:
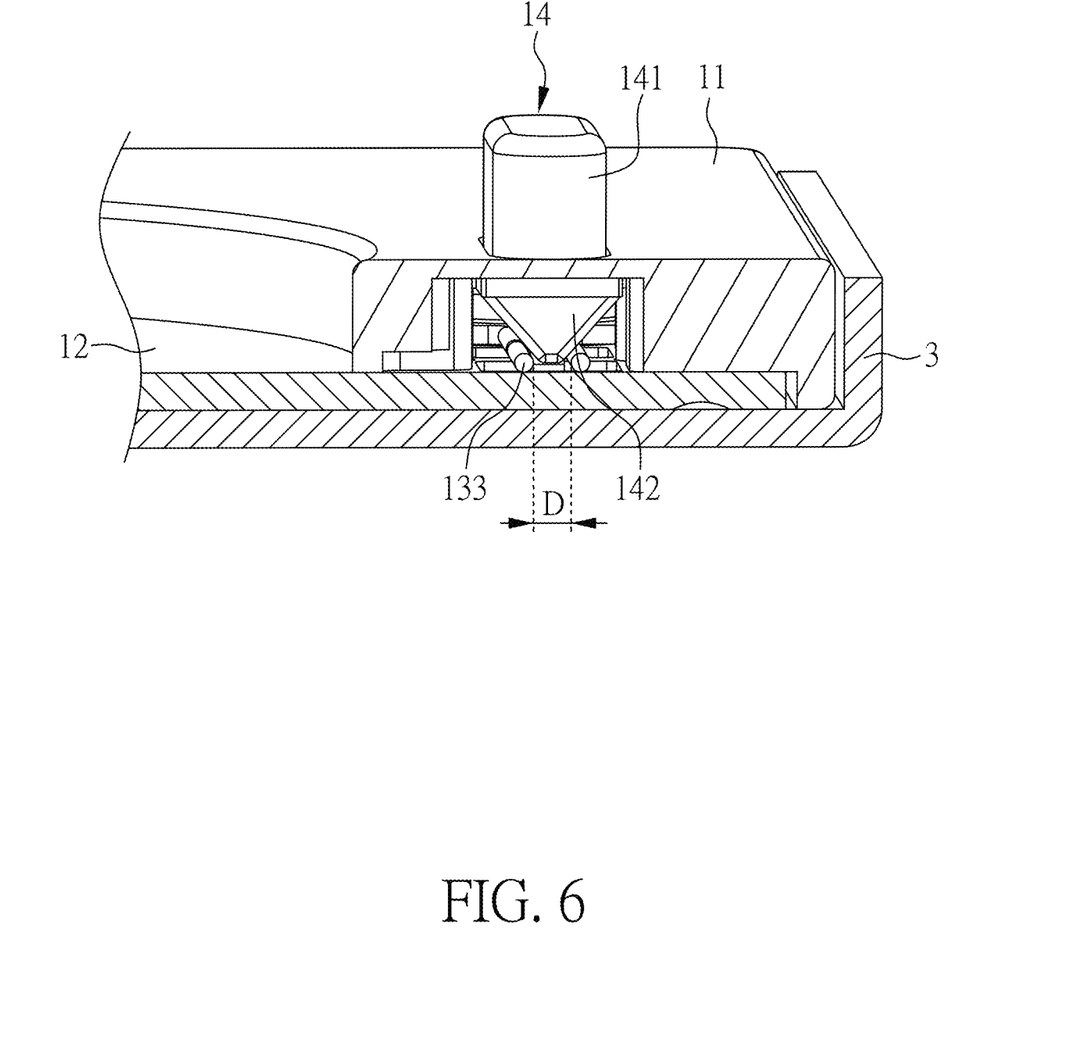
FIG. 6 is a partial cross-sectional view showing an embodiment of the quick release structure of the present invention.

Please refer to FIG. 6. FIG. 6 is a partial of cross-sectional view showing the quick release structure 100 of the present invention. As shown in FIG. 6, an interval D is formed between the two tail sections 133 of the elastic members 13, and the operating button 14 movably abuts against between the tail sections 133. The operating button 14 includes a pressing portion 141 and a tapered portion 142 relative to the pressing portion 141. The pressing portion 141 protrudes from the first main board 11 and penetrates through the containing hole 111. The tapered portion 142 faces toward the second main board 12, and a width of the tapered portion 142 is decreased from the first main board 11 to the second main board 12. The tapered portion 142 slidably abuts against the tail sections 133 of the elastic members 13. When the external force is applied to the pressing portion 141, the operating button 14 moves toward the second main board 12, the tapered portion 142 is configured to deform the elastic members 13, and the interval D between the two tail sections 133 is increased. Moreover, when the external force is removed, the interval D between the two tail sections 133 is decreased by an elastic restoring force, so that the operating button 14 is reset.

Figure 7:
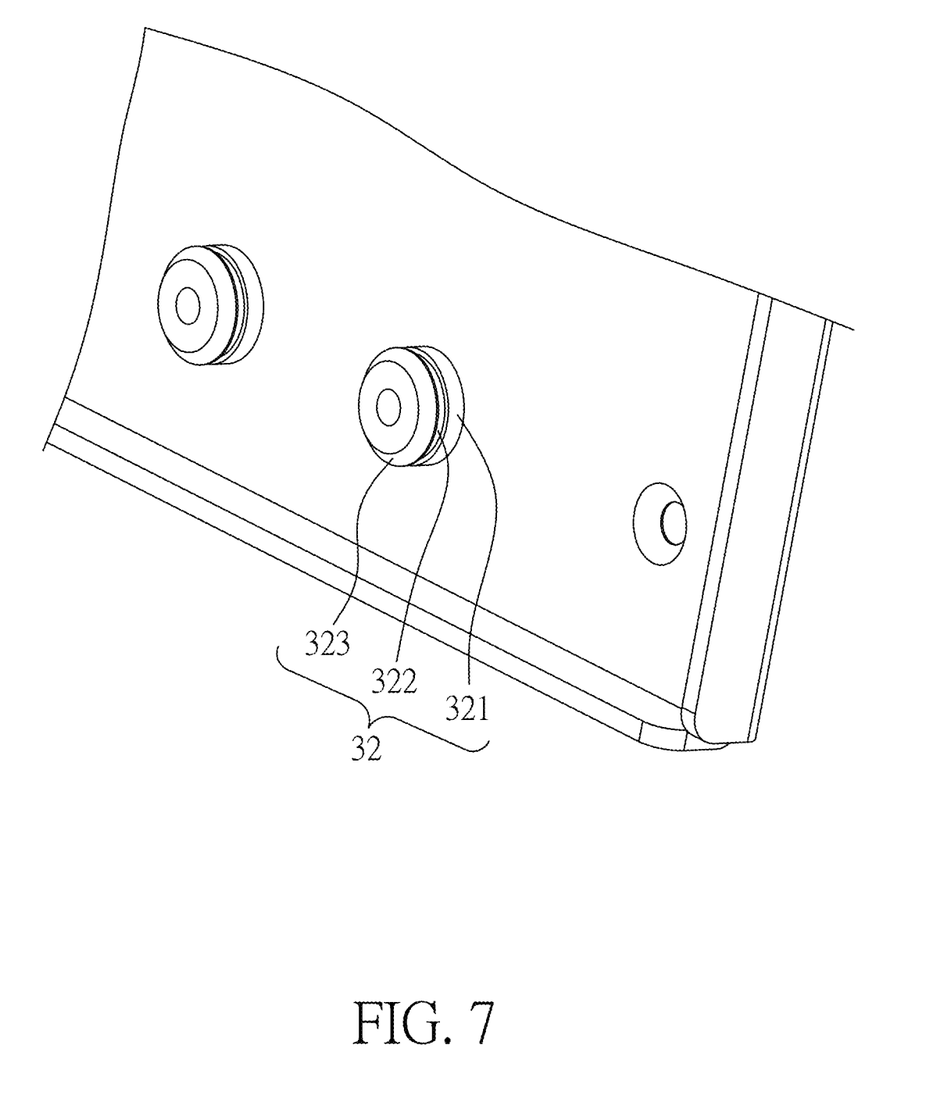
FIG. 7 is a partially enlarged schematic view showing an embodiment of the housing module of the present invention.

Please refer to FIG. 7. FIG. 7 is a partially enlarged schematic view showing the housing module 3 of the present invention. As shown in FIG. 7, each of the limit columns 32 includes an outer periphery 321, a groove 322 formed on the outer periphery 321, and an annular incline plane 323.

In the assembling status, one of the elastic member 13 is partially accommodated in the corresponding groove 322. It is noticed that, when the bearing module 1 and the housing module 3 are in the assembling status, each of the limit columns 32 is configured to utilize the annular incline plane 323 to push the clamping sections 132 of each of the elastic members 13, so that the clamping sections 132 are deformed. Thus, the two clamping sections 132 are accommodated in the corresponding groove 322.

Each of the elastic members 13 can be implemented as a clip spring, which is formed by bending a metal wire. In the embodiment, each of the clip springs is bent into a U-shaped structure (it means that the headend 131, the clamping sections 132 extending from the headend 131 and the tail sections 133) and is correspondingly sleeved on each of the positioning columns 15 to clamp each of the limit columns 32. It is noticed that, the groove 322 can be milled into a closed annular and surround the outer periphery 321, and thus the two clamping sections 132 are accommodated in the groove 322.

Figure 8A:
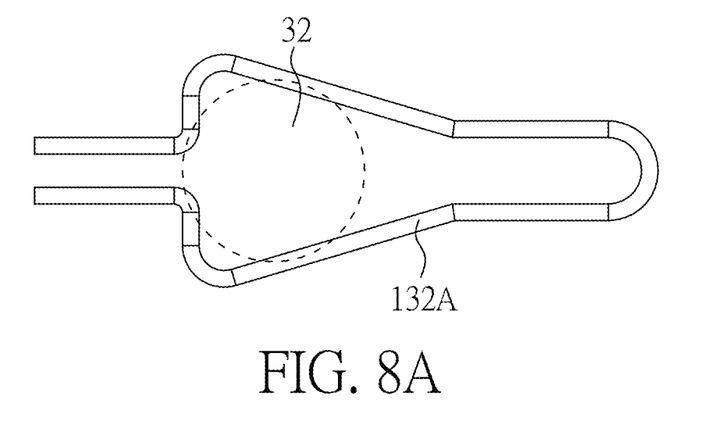
FIG. 8A to FIG. 8C are schematic views showing various embodiments of the elastic member.
Figure 8B:
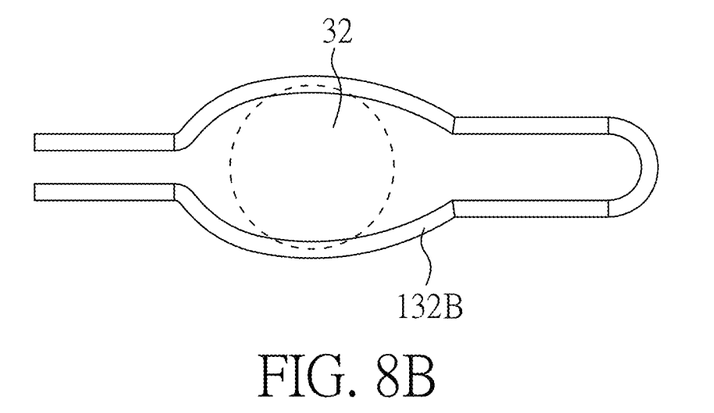
Figure 8C:
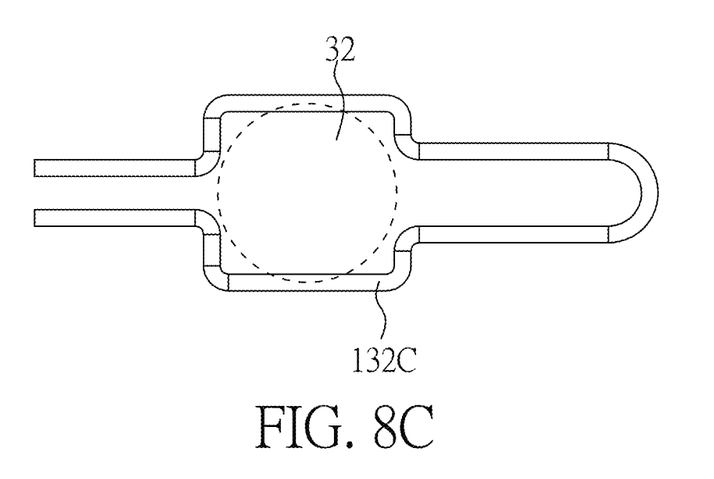

Please refer to FIG. 8A to FIG. 8C. FIG. 8A to FIG. 8C are schematic views showing various embodiments of the clip spring of the present invention. As shown in FIG. 8A to FIG. 8C, the clip spring can be implemented as different shapes. For example, the clamping sections 132A can be implemented as a triangle and have at least four positions in contact with the limit columns 32. In another embodiment, the clamping sections 132B can be implemented as an arc and have at least two positions in contact with the limit columns 32. In a further embodiment, the clamping sections 132C can be implemented as a rectangle and have at least six positions in contact with the limit columns 32. However, regardless the shape of the clip spring, there are at least two positions in contact with the groove 322.

In another embodiment, the elastic members 13 can be implemented as a clip spring that is bent into a U-shaped structure but only has a buckle structure on one side (it means that the headend, an one-sided clamping section and an one-sided tail section) and is sleeved and fixed on the positioning columns 15 with the one-sided clamping section to clamp the limit columns 32. The one-sided clamping section has at least one position in contact with the groove 322. It is noticed that, the groove 322 can be milled into an opened annular and surrounded partial of the outer periphery 321 for the one-sided clamping section 132 being accommodated in the groove 322. In another embodiment, the elastic members 13 are not limited to being manufactured by bending the metal wire. It also can be implemented as a sheet metal spring, which surrounds the corresponding limit columns 32 and engages with the groove 322, once the elastic member 13 has rigidity and elasticity.

In another embodiment, the positions of the operating button and the limit columns can be switched. In detail, the operating button is disposed on the housing of the housing module, the limit columns are fixedly connected to the first main board, and the elastic members are fixedly connected to the second main board. For the convenience of the user, the operating button can be disposed on the side of the housing of the housing module.

Based on the aforesaid embodiments, the quick release structure are capable of utilizing the clip spring and the limit columns to fix the quick release structure on the supporting stand. When the external force is applied to the operating button, the operating button is configured to stretch the elastic members, so that the housing module can be detached from the supporting stand. In this way, by assembling the housing module on the housing of the display, the display can be quickly assembled with or detached from the supporting stand. Moreover, the clip spring and the limit columns are utilized to achieve the function of the quick release device, and reduced the amount of assembly parts to achieve the effect of reducing the cost of the quick release structure.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A quick release structure for bearing a display on a supporting stand, the quick release structure comprising:
   a bearing module being disposed on the supporting stand, the bearing module, comprising:
      a first main board;
      a second main board being secured to the first main board and including a plurality of perforations;
      an accommodating space formed between the first main board and the second main board;
      a plurality of elastic members being disposed in the accommodating space; and
      an operating button movably penetrating through the first main board and extending into the accommodating space to abut against the elastic members; and
   a housing module being disposed on the display and comprising a housing and a plurality of limit columns being disposed on the housing;
   wherein, when the bearing module and the housing module are in an assembling status, the limit columns penetrate the perforations and are engaged with the corresponding elastic members, respectively, and when an external force is applied to the operating button, the operating button is configured to deform the elastic members for detaching the limit columns from the elastic members.

2. The quick release structure as claimed in claim 1, wherein each of the limit columns comprises an outer periphery and a groove formed on the outer periphery, and in the assembling status, each of the elastic members is partially accommodated in the groove respectively.

3. The quick release structure as claimed in claim 2, wherein each of the elastic member comprises a headend, two clamping sections extending from the headend, and two tail sections respectively connected to the clamping sections and opposite to the headend.

4. The quick release structure as claimed in claim 3, wherein the bearing module further comprises a plurality of positioning columns being disposed between the first main board and the second main board, the headends are correspondingly sleeved on the positioning columns respectively, the two clamping sections correspondingly clamp the limit columns respectively, and the operating button movably abuts against the two tail sections therebetween.

5. The quick release structure as claimed in claim 4, wherein the positioning columns are step screws, and the step screws are secured on the second main board to limit the headends of the elastic members respectively.

6. The quick release structure as claimed in claim 5, wherein an interval is formed between the corresponding two tail sections, and the operating button comprises a pressing portion and a tapered portion relative to the pressing portion, wherein the pressing portion protrudes from the first main board, the tapered portion faces towards the second main board, is tapered from the first main board to the second main board, and abuts against the two tail sections, when the external force is applied to the pressing portion, the operating button moves toward the second main board, and the tapered portion is configured to deform the elastic members to increase the interval between the corresponding two tail sections.

7. The quick release structure as claimed in claim 6, wherein when the external force is removed, the interval between the corresponding two tail sections is decreased by an elastic restoring force to reset the operating button.

8. The quick release structure as claimed in claim 7, wherein the first main board further comprises a containing hole for the pressing portion of the operating button penetrating therethrough.

9. The quick release structure as claimed in claim 3, wherein each of the limit columns includes an annular incline plane, when the bearing module and the housing module are in the assembling status, each of the limit columns is configured to utilize the annular incline plane to push the two clamping sections of each of the elastic members correspondingly, so that the two clamping sections are accommodated in the groove.

10. The quick release structure as claimed in claim 9, wherein each of the elastic members is a clip spring, which is formed by bending a metal wire.

11. The quick release structure as claimed in claim 9, wherein each of the elastic members is a sheet metal spring, which correspondingly surrounds each of the limit columns and engages with each of the grooves.

12. The quick release structure as claimed in claim 9, wherein the second main board further comprises at least one lug portion to buckle on the housing.

\* \* \* \* \*